(12) United States Patent
Kim

(10) Patent No.: US 7,277,331 B2
(45) Date of Patent: Oct. 2, 2007

(54) SEMICONDUCTOR MEMORY DEVICE FOR ADJUSTING IMPEDANCE OF DATA OUTPUT DRIVER

(75) Inventor: Kyung-Hoon Kim, Ichon-shi (KR)

(73) Assignee: Hynix Semiconductor Inc. (KR)

( * ) Notice: Subject to any disclaimer, the term of this patent is extended or adjusted under 35 U.S.C. 154(b) by 113 days.

(21) Appl. No.: 11/319,615

(22) Filed: Dec. 29, 2005

(65) Prior Publication Data

US 2007/0070717 A1    Mar. 29, 2007

(30) Foreign Application Priority Data

Sep. 27, 2005    (KR) .................... 10-2005-0090061

(51) Int. Cl.
    *G11C 7/10*    (2006.01)
(52) U.S. Cl. .................. 365/189.05; 365/201
(58) Field of Classification Search .......... 365/189.05, 365/201, 189.07, 189.11
    See application file for complete search history.

(56) References Cited

U.S. PATENT DOCUMENTS

| | | | |
|---|---|---|---|
| 5,144,165 A | 9/1992 | Dhong et al. | |
| 5,319,258 A | 6/1994 | Ruetz | |
| 6,307,791 B1 * | 10/2001 | Otsuka et al. | ......... 365/189.05 |
| 6,556,052 B2 | 4/2003 | Garrett, Jr. et al. | |
| 6,751,782 B2 * | 6/2004 | Levin et al. | .................... 716/1 |
| 6,870,419 B1 | 3/2005 | Garrett, Jr. et al. | |
| 7,126,326 B2 * | 10/2006 | Muller | .................... 324/158.1 |
| 2005/0057981 A1 | 3/2005 | Yoo | |
| 2005/0116736 A1 | 6/2005 | Blodgett et al. | |

FOREIGN PATENT DOCUMENTS

| | | |
|---|---|---|
| JP | 9-64720 A | 3/1997 |
| KR | 1999-017367 | 3/1999 |
| KR | 2003-0026008 | 3/2003 |
| KR | 10-2004-0076715 | 9/2004 |
| KR | 10-2005-0022163 | 3/2005 |

\* cited by examiner

*Primary Examiner*—Anh Phung
(74) *Attorney, Agent, or Firm*—McDermott Will & Emery LLP

(57) ABSTRACT

An apparatus for comparing inputted signals by removing an offset voltage during adjusting an output impedance of a semiconductor memory device, includes a voltage comparator for comparing a first input signal applied to its positive input node with a second input signal applied to its negative input node to output a first output signal to its positive output node and its second output signal to a negative output node; a switched capacitive unit for removing an offset voltage occurred in the positive input node, the negative input node, the positive output node and the negative output node of the voltage comparator; and a latch unit for latching the first output signal and the second output signal.

15 Claims, 8 Drawing Sheets

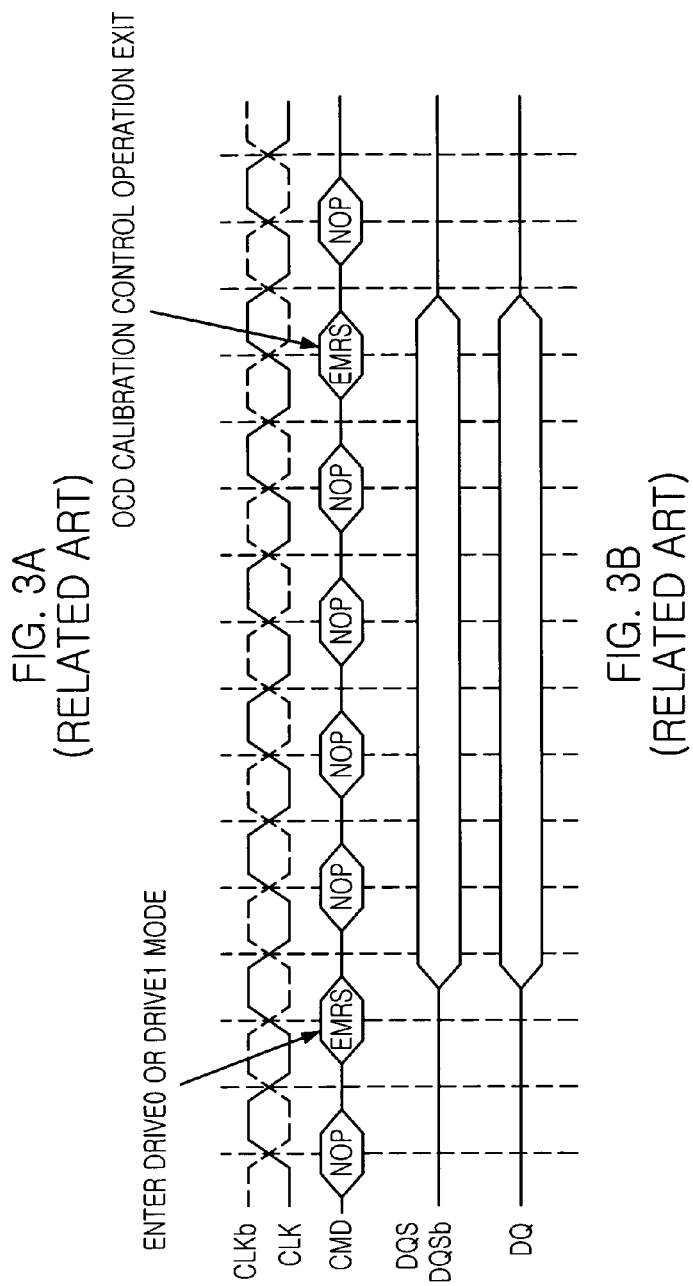

ID OF DATA
OUTPUT DRIVER

SEMICONDUCTOR MEMORY DEVICE FOR ADJUSTING IMPEDANCE OF DATA OUTPUT DRIVER

FIELD OF THE INVENTION

The present invention relates to a semiconductor memory device; and, more particularly, to a semiconductor memory device for adjusting an output impedance of an output driver.

DESCRIPTION OF RELATED ARTS

A dynamic random access memory (DRAM) has been improved continuously to increase its operational speed. Synchronizing an internal clock signal with an external clock signal is one of methods to improve the operational speed of the DRAM. The DRAM operating in synchronization with the external clock signal is called a synchronous DRAM (SDRAM).

The SDRAM performs a data access operation in synchronization with a rising edge of the external clock signal. That is, the SDRAM can perform the data access operation once within one cycle of the external clock signal. Such an SDRAM that performs the data access operation once within one cycle of the external clock signal is particularly called a single data rate (SDR) SDRAM.

However, the SDR SDRAM had to be more improved for use in a high speed system. Therefore, a double data rate (DDR) SDRAM has been developed. The DDR SDRAM performs the data access operation in synchronization with a rising edge and a falling edge of the external clock signal. That is, the DDR SDRAM performs the data access operation twice within one cycle of the external clock signal. Hence, even if the frequency of the external clock signal is not increased, the DDR SDRAM has a bandwidth at least twice larger than that of the SDR SDRAM to guarantee a high speed operation.

In the meantime, a double data rate 2 (DDR2) SDRAM is an upgraded version of the DDR SDRAM. For enhancing an operational speed of the DDR2 SDRAM, new concepts have been proposed by an international electronics standardization organization, namely the Joint Electron Device Engineering Council (JEDEC).

An off chip driver (OCD) calibration control is one of the proposed new concepts. The OCD calibration control is performed by optimizing the impedance of a data output driver for a current system. The impedance optimization is accomplished by measuring a current flowing from an external device such as a chipset to the data output driver or a voltage supplied to the data output driver from the chipset. Therefore, for that purpose described above, the DDR2 SDRAM should have the ability of adjusting the impedance of the data output driver.

An on die termination (ODT) is also one of the proposed new concepts. The ODT adjusts the resistance of a data input/output pad when the semiconductor memory device is integrated on a main board, thereby transmitting a data signal without impedance discordance.

FIG. 1 is a block diagram showing a data interface between a chipset and a conventional DDR SDRAM.

The data interface in FIG. 1 shows roughly how data access operation is performed.

As described in FIG. 1, the conventional DDR SDRAM receives a plurality of command signals such as a chip selection bar signal /CS, a write enable bar signal /WE, a clock signal CLK and a clock bar signal /CLK from the chipset through plural command input pins. The conventional DDR SDRAM also receives a plurality of address signals A0 to A15 through plural address input pins. In addition, the conventional DDR SDRAM receives or outputs data DQ0 to DQ15 through a plurality of data input/output (I/O) pins.

The conventional DDR SDRAM receives a data strobe signal DQS and a data strobe bar signal /DQS, i.e., an inverted data strobe signal, through data strobe input pins. The data strobe signal DQS is clocked and inputted to the conventional DDR SDRAM during the timing of data inputted. The conventional DDR SDRAM aligns the inputted data using the data strobe signal DQS and transfers the aligned data to an internal core thereof. Likewise, the conventional DDR SDRAM outputs data by generating an internal data strobe signal that is clocked during the timing of the data outputted.

FIG. 2 is a flow chart showing a sequence of performing an OCD calibration control operation proposed by the JEDEC. Each step in the sequence is marked by step numbers from S10 to S21.

The sequence is roughly divided into two steps, i.e., a first step for measuring an output impedance of a data output driver and a second step for adjusting the output impedance to the status of a current system.

The data output driver including a pull-up driver and a pull-down driver activates one of those drivers to output a data. That is, the data output driver outputs the data as a logic level 'HIGH' through the pull-up driver and the data as a logic level 'LOW' through the pull-down driver. Therefore, the output impedance of the data output driver should be measured by measuring an output impedance of the pull-up driver or that of the pull-down driver. In a first drive mode DRIVE1, the output impedance of the pull-up driver is measured, and, in a second drive mode DRIVE0, the output impedance of the pull-down driver is measured.

The sequence of performing the OCD calibration control operation is described in FIG. 2.

First, when an extended mode register set (EMRS) of the DDR SDRAM enters into the OCD calibration control operation, the EMRS sets a drive mode to the first drive mode DRIVE1. Then, all of the output data DQ0 to DQ15 and the data strobe signal DQS become a logic level 'HIGH', and the data strobe bar signal /DQS becomes a logic level 'LOW' as shown in step S10.

Herein, in the first drive mode DRIVE1, the output impedance of the data output driver is measured when the pull-up driver outputs the data as a logic level 'HIGH'. The EMRS means a mode for outputting values which are set to internal registers to define various operations of the conventional DDR SDRAM.

Thereafter, the chipset measures the output impedance of the pull-up driver. If it is determined in step S11 that the measured output impedance is not the optimized value for the current system, the EMRS enters into an adjustment mode for adjusting the output impedance of the pull-up driver in step S12.

In the adjustment mode, the output impedance of the pull-up driver is increased or decreased by decoding a burst code inputted through the data I/O pins to thereby adjust the output impedance of the pull-up driver in step S13. Herein, a burst length (BL) of the burst code is set to 4 bits and the chipset outputs the burst code and measures the output impedance.

The output impedance of the pull-up driver is adjusted by varying the number of turned-on pull-up MOS transistors among whole pull-up MOS transistors which are connected in parallel and included in the pull-up driver.

Continuously, the EMRS exits from the OCD calibration control mode in step S14 and then the EMRS sets the drive mode to the first drive mode DRIVE1 for measuring the output impedance of the pull-up driver again in the step 10. If it is determined again that the output impedance of the pull-up driver is not the optimized value, the output impedance of the pull-up driver is adjusted again to have the optimized value by the same way described in the step S13.

In the step S11, if the measured output impedance is determined to have the optimized value, the EMRS exits from the OCD calibration control mode in step S15 and then the EMRS sets the drive mode to the second drive mode DRIVE0 in step S16.

In the second drive mode DRIVE0, the output impedance of the data output driver is measured when the pull-down driver outputs the data as a logic level 'LOW'.

Thereafter, the chipset measures the output impedance of the pull-down driver. In step S17, if the measured output impedance is determined to have the optimized value, the EMRS exits from the OCD calibration control operation in step S21.

On the other hand, if the measured output impedance is decided not to have the optimized value, the EMRS enters into the adjustment mode for adjusting the output impedance of the pull-down driver in step S18. Then, steps S19, S20, S16 and S17 are performed repeatedly until the measured output impedance of the pull-down driver becomes the optimized value. Finally, if the measured output impedance becomes the optimized value, the EMRS exits from the OCD calibration control operation in the step S21.

In FIGS. 3A and 3B, there is described in detail the operation of measuring the output impedance of the data output driver.

FIG. 3A is a timing diagram showing the operation of measuring the output impedance of the data output driver while the OCD calibration control operation is performed.

FIG. 3B is a table describing operational modes according to a 3-bit control signal in the operation of measuring the output impedance of the data output driver shown in FIG. 3A, wherein the 3-bit control signal is inputted through address pins A7, A8 and A9.

To begin with, the chipset inputs the 3-bit control signal to the conventional DDR SDRAM so as to control an output mode of the EMRS to be the first drive mode DRIVE1 or the second driver mode DRIVE0.

Herein, the 3-bit control signal is inputted through the address pins A7 to A9 as above mentioned. A status of the OCD calibration control operation according to the 3-bit control signal is shown in the table of FIG. 3B.

For example, if the 3-bit control signal is inputted as '001', the output mode of the EMRS becomes the first driver mode DRIVE1; if '010', the second drive mode DRIVE0; and if '100', the adjustment mode. On the other hand, if the 3-bit control signal is inputted as '111', the output impedance of the data output driver keeps a default impedance value.

In the first drive mode DRIVE1, the data output driver in the DDR SDRAM outputs the data as a logic level 'HIGH' and thus the output impedance of the pull-up driver is measured.

In the second drive mode DRIVE0, the data output driver in the DDR SDRAM outputs the data as a logic level 'LOW' and thus the output impedance of the pull-down driver is measured.

The operation of adjusting the output impedance of the data output driver is described in detail referring to FIGS. 4A and 4B.

FIG. 4A is a timing diagram showing the operation of adjusting the output impedance of the data output driver while the OCD calibration control mode is performed and FIG. 4B provides a table showing the OCD calibration control operation according to the burst code.

Hereinafter, with reference to FIGS. 4A and 4B, the operation of adjusting the output impedance of the data output driver is explained in detail.

After the EMRS enters into the adjustment mode, the chipset inputs burst codes having 4 bits DT0 to DT3 (hereinafter, referred to as 4-bit burst codes) to the conventional DDR SDRAM through the data I/O pins.

The table shown in FIG. 4B describes the operation of the adjustment mode according to the 4-bit burst codes DT0 to DT3.

The operation in the adjustment mode is performed by selectively turning on or off MOS transistors included in the data output driver.

For example, if the 4-bit burst codes DT0 to DT3 are inputted as '1000', the number of turned-on MOS transistors in the pull-down driver is decreased by one. If the 4-bit burst codes DT0 to DT3 are inputted as '1001', the number of turned-on MOS transistors in the pull-up driver is increased by one and the number of turned-on MOS transistors in the pull-down driver is decreased by one.

After adjusting the number of turned-on MOS transistors in the pull-up or the pull-down driver based on the 4-bit burst codes, the OCD calibration control operation is finished.

In the mean time, in the conventional DDR SDRAM, a device for controlling the output impedance of the data output driver is not required. However, recently, it becomes possible to control the output impedance of the data output driver by dividing the output impedance into plural unit steps. Accordingly, a device for controlling the output impedance of the data output driver is required.

Hereinbefore, there has been illustrated the OCD according to the DDR2 specification.

Meanwhile, in a double data rate 3 (DDR3) SDRAM, which is an upgraded version of the DDR2 SDRAM, the device for controlling the output impedance of the data output driver includes a test pad (hereinafter, referred to as a ZQ PAD) for measuring the impedance of the data output driver so as to optimize the impedance of a data input/output pad (hereinafter, referred to as a DQ PAD) by detecting a voltage level at the ZQ PAD.

The operation of performing the OCD calibration control using the device for controlling the output impedance of the data output driver is described in FIG. 5.

FIG. 5 is a block diagram depicting the device for performing the OCD calibration control in the conventional DDR SDRAM, especially, the DDR3 SDRAM.

As shown in FIG. 5, the device for performing the OCD calibration control includes a ZQ PAD 10, a pull-up driving unit, a pull-down driving unit, a reference signal generating unit 20, an OCD control unit 30, an EMRS control unit 40 and a DQ PAD 50.

The pull-up driving unit includes a first and a second pull-up impedance measuring unit 12 and 14, a first and a second pull-up impedance adjusting unit 42 and 44, a first comparator 22 and a first code converter 26.

An operation for determining a pull-up impedance of the pull-up driving unit is described as follows.

First, the first pull-up impedance measuring unit 12 including a plurality of PMOS transistors connected in parallel makes a predetermined number of PMOS transistors among the PMOS transistors be turned on.

The reference signal generating unit 20 outputs a first reference signal Vref1 having a voltage level of half of a source voltage VDD and the first comparator 22 compares a pull-up test signal Vzq1 coupled from the ZQ PAD 10 with the first reference signal Vref1 under the control of the OCD control unit 30.

The first code converter 26 decodes the comparison result of the first comparator 22 to output a decoded comparison value to the first pull-up impedance measuring unit 12, the second pull-up impedance measuring unit 14 and the first pull-up impedance adjusting unit 42.

In case that the first reference signal Vref1 is higher than the pull-up test signal Vzq1, the first pull-up impedance measuring unit 12 increases the number of turned-on PMOS transistors therein so as to decrease the pull-up impedance coupled to the ZQ PAD 10.

In case that the first reference signal Vref1 is lower than the pull-up test signal Vzq1, the first pull-up impedance measuring unit 12 decreases the number of turned-on transistors therein so as to increase the pull-up impedance coupled to the ZQ PAD 10.

As described above, it is possible to control the pull-up impedance coupled to the ZQ PAD 10 according to the voltage level of the first reference signal Vref1.

In case that the first reference signal Vref1 is equal to the pull-up test signal Vzq1, the first pull-up impedance adjusting unit 42 determines the pull-up impedance coupled to the DQ PAD 50 based on the decoded value outputted from the first code converter 26. Namely, the first pull-up impedance adjusting unit 42 including a plurality of PMOS transistors connected in parallel adjusts the number of turned-on PMOS transistors therein according to the decoded value of the first code converter 26. In this way, the pull-up impedance of the pull-up driving unit is determined when the DQ PAD 50 is pulled up.

In the same way, a pull-down impedance of the pull-down driving unit is adjusted based on the adjusted pull-up impedance of the pull-up driving unit.

The pull-down driving unit includes a pull-down impedance measuring unit 16, a first and a second pull-down impedance adjusting unit 46 and 48, a second comparator 24 and a second code converter 28.

An operation for determining the pull-down impedance of the pull-down driving unit is described as follows.

First, the second pull-up impedance measuring unit 14 including a plurality of NMOS transistors connected in parallel adjusts the number of turned-on NMOS transistors therein, wherein the number of turned-on NMOS transistor at the second pull-up impedance measuring unit 14 is identical to the number of turned-on PMOS transistors at the first pull-up impedance measuring unit 12.

The reference signal generating unit 20 outputs a second reference signal Vref2 having a voltage level of half of the source voltage VDD. The second comparator 24 compares a pull-down test signal Vzq2 inputted from the second pull-up impedance measuring unit 14 with the second reference signal Vref2 under the control of the OCD control unit 30.

The second code converter 28 decodes the comparison result of the second comparator 24 to output a decoded value to the pull-down impedance measuring unit 16 and the second pull-down impedance adjusting unit 46.

In case that the second reference signal Vref2 is higher than the pull-down test signal Vzq2, the pull-down impedance measuring unit 16 increases the number of turned-on NMOS transistors so as to decrease the pull down impedance coupled to the ZQ PAD 10.

In case that the second reference signal Vref2 is lower than the pull-down test signal Vzq2, the pull-down impedance measuring unit 16 decreases the number of turned-on NMOS transistors so as to increase the pull-down impedance coupled to the ZQ PAD 10.

In case that the second reference signal Vref2 is equal to the pull-down test signal Vzq2, the second pull-down impedance adjusting unit 46 determines the pull-down impedance of the DQ PAD 50 based on the decoded value of the second code converter 28. Namely, the first pull-down impedance adjusting unit 46 including a plurality of NMOS transistors connected in parallel adjusts the number of turned-on NMOS transistors therein based on the decoded value of the second code converter 28. In this way, the pull-down impedance of the pull-down driving unit is determined when the DQ PAD 50 is pulled down.

As described above, the fabrication of the semiconductor memory device is finished after the OCD calibration control operation is performed. However, sometimes, the pull-up or the pull-down impedance applied to the DQ PAD 50 may be variable because of several problems occurred in the fabricated semiconductor memory device.

Also, when the semiconductor memory device is applied to a specific system, the pull-up or the pull-down impedance applied to the DQ PAD 50 needs to be changed. In this time, it is possible to change the pull-up impedance applied to the DQ PAD 50 by adjusting the number of the pull-up PMOS transistors connected in parallel at the second pull-up impedance adjusting unit 44 based on a control signal outputted from the EMRS control unit 40. Also, it is possible to change the pull-down impedance applied to the DQ PAD 50 by adjusting the number of the pull-down NMOS transistors connected in parallel at the first pull-down impedance adjusting unit 48 based on the control signal outputted from the EMRS control unit 40.

FIG. 6 is a block diagram depicting a comparing unit of the device for performing the OCD calibration control shown in FIG. 5 in detail. Herein, the second comparing unit 24 has the same circuit structure as that of the first comparing unit 22. The first comparing unit 22 is explained as an example as follows.

As shown, the first comparing unit 22 includes a voltage comparator 22a and a latch unit 22b.

The voltage comparator 22a compares the first reference signal with the pull-up test signal Vzq1. The latch unit 22b latches an output signal of the voltage comparator 22a to save a signal corresponding to the output signal of the voltage comparator 22a.

In the meantime, the voltage comparator 22a compares continuously while a first clock CLK1 inputted to an enable node EN of the voltage comparator 22a is activated. If a noise is occurred in the source voltage VDD or a ground voltage VSS during the OCD calibration control operation, one input node of the voltage comparator 22a is considerably affected by the noise. As a result, the voltage comparator 22a may output wrong comparison results.

Moreover, because the comparing unit 22 shown in FIG. 6 does not include a circuit for removing an offset voltage inputted to the input node of the voltage comparator 22a, the voltage comparator 22a may be affected by the offset voltage. As a result, the voltage comparator 22a may output a wrong comparison result.

SUMMARY OF THE INVENTION

It is, therefore, an object of the present invention to provide a semiconductor memory device for removing an offset error in a comparing unit for performing an OCD/ODT calibration control operation.

In accordance with an aspect of the present invention, there is provided a semiconductor memory device for removing an offset error of a comparing unit for performing an OCD/ODT calibration control operation, including: a reference signal generating unit for generating a reference signal; a comparing unit for comparing the reference signal with a test signal applied to a test pad to thereby output an adjusted value to the test pad after adjusting the adjusted value until the test signal is equal to the reference signal; and an impedance measuring unit for measuring an impedance of the test pad based on the adjusted value to output the test signal to the comparing unit, wherein the comparing unit includes: a voltage comparator for comparing a first input signal applied to its positive input node with a second input signal applied to its negative input node to output a first output signal to its positive output node and a second output signal to its negative output node; a switched capacitive unit for receiving the reference signal and the test signal to remove an offset voltage occurred in the positive input node, the negative input node, the positive output node and the negative output node of the voltage comparator; and a latch unit for latching the first output signal and the second output signal to output the adjusted value.

In accordance with another aspect of the present invention, there is provided an apparatus for comparing inputted signals by removing an offset voltage during adjusting an output impedance of a semiconductor memory device, including: a voltage comparator for comparing a first input signal applied to its positive input node with a second input signal applied to its negative input node to output a first output signal to its positive output node and its second output signal to a negative output node; a switched capacitive unit for removing an offset voltage occurred in the positive input node, the negative input node, the positive output node and the negative output node of the voltage comparator; and a latch unit for latching the first output signal and the second output signal.

BRIEF DESCRIPTION OF THE DRAWINGS

The above and other objects and features of the present invention will become apparent from the following description of preferred embodiments taken in conjunction with the accompanying drawings, in which:

FIG. 3A is a timing diagram showing an operation of measuring an output impedance of a data output driver;

FIG. 3B is an operation table showing an operation of performing the OCD calibration control mode in response to a 3-bit control signal;

DETAILED DESCRIPTION OF INVENTION

Hereinafter, a synchronous semiconductor memory device in accordance with the present invention will be described in detail referring to the accompanying drawings.

Figure 1:
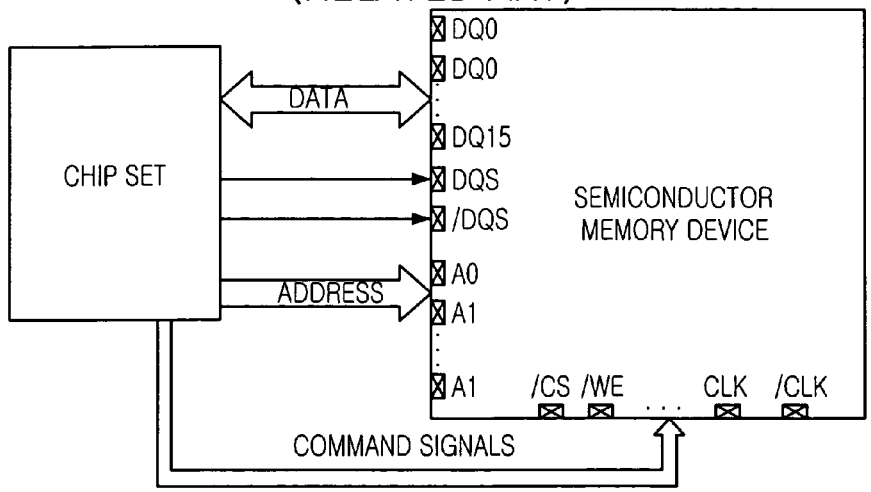
FIG. 1 is a block diagram showing a data interface between a chipset and a conventional DDR SDRAM.
Figure 2:
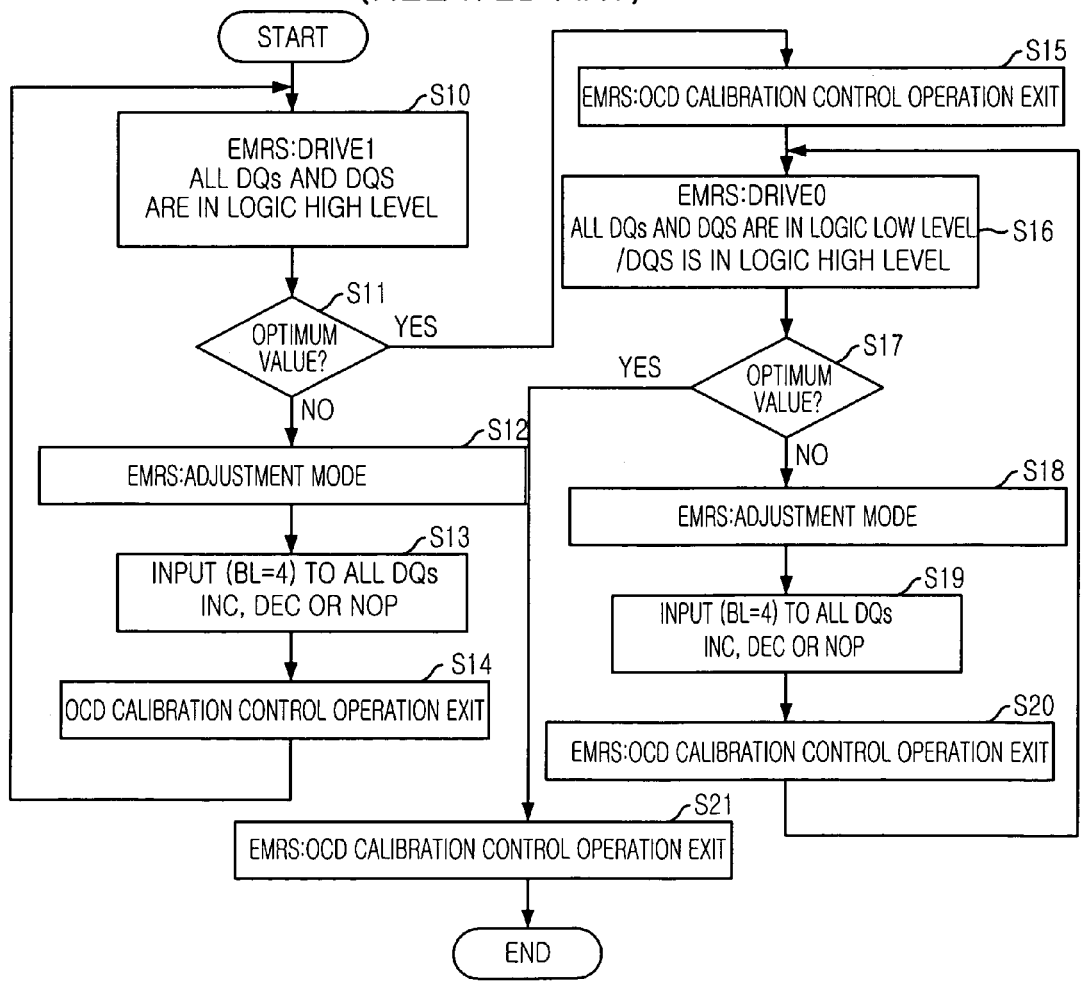
FIG. 2 is a flow chart showing an operational sequence of performing an OCD calibration control mode proposed by the JEDEC.
Figures 4A, 4B:
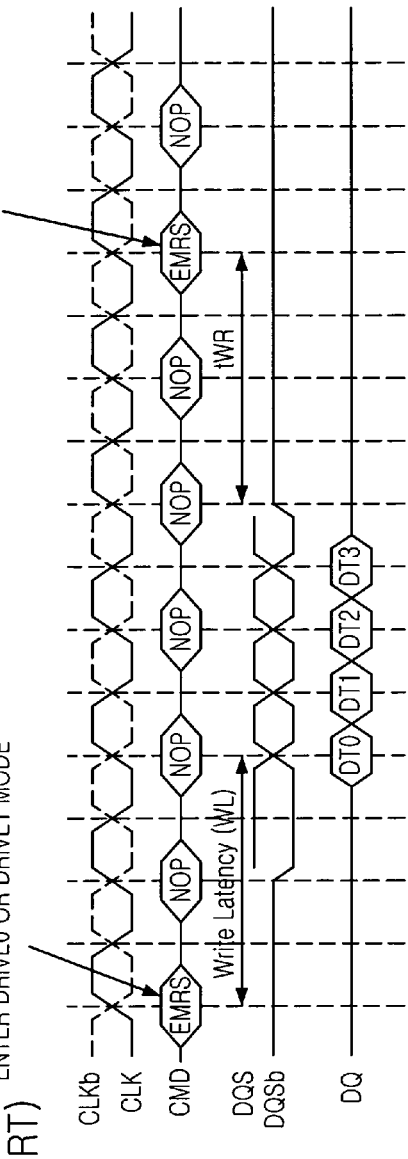
FIG. 4A is a timing diagram showing an operation of adjusting the output impedance of the data output driver.
FIG. 4B is an operation table showing an operation of performing the OCD calibration control mode in response to a burst code.
Figure 5:
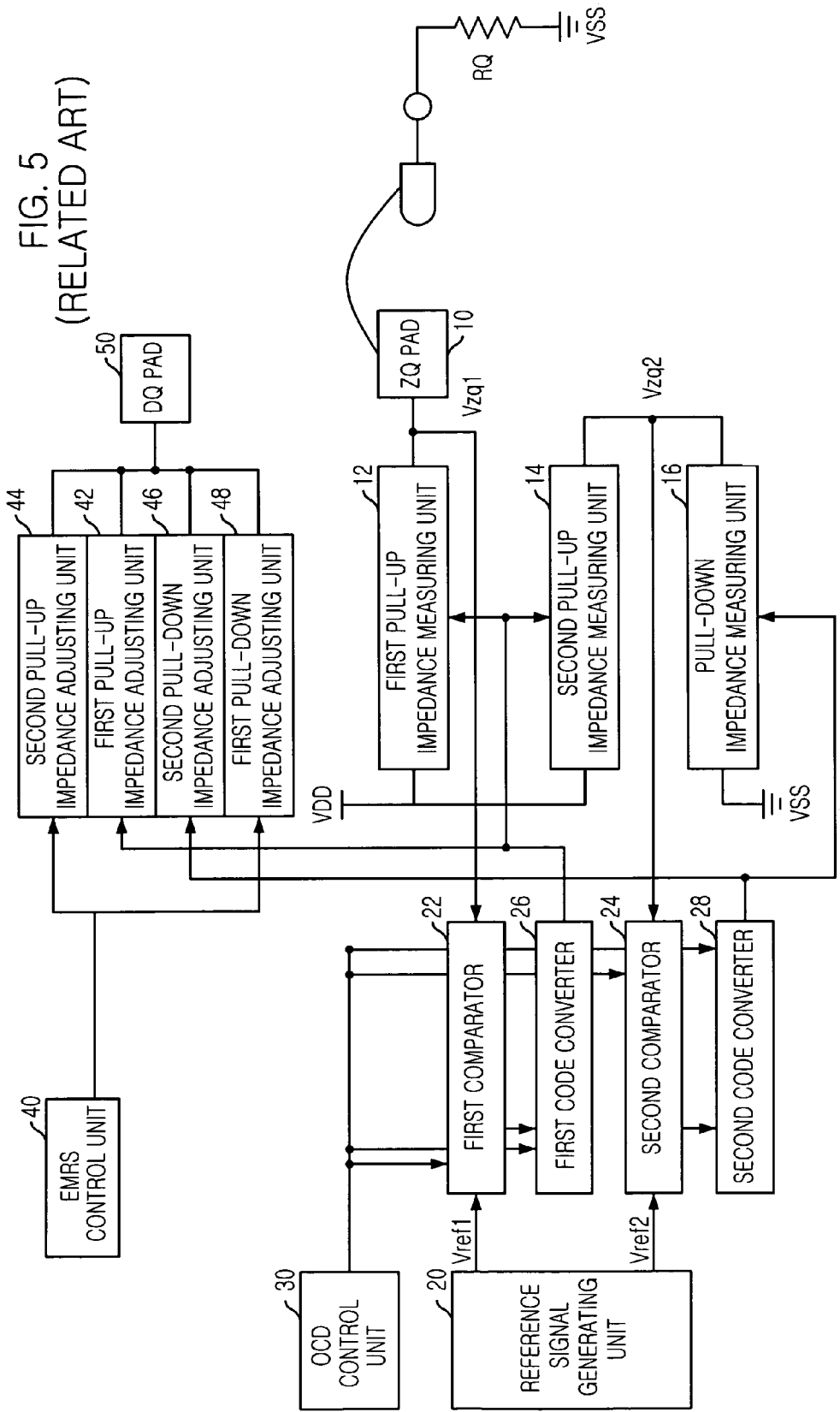
FIG. 5 is a block diagram depicting a device for performing the OCD calibration control in a conventional DDR SDRAM.
Figure 6:
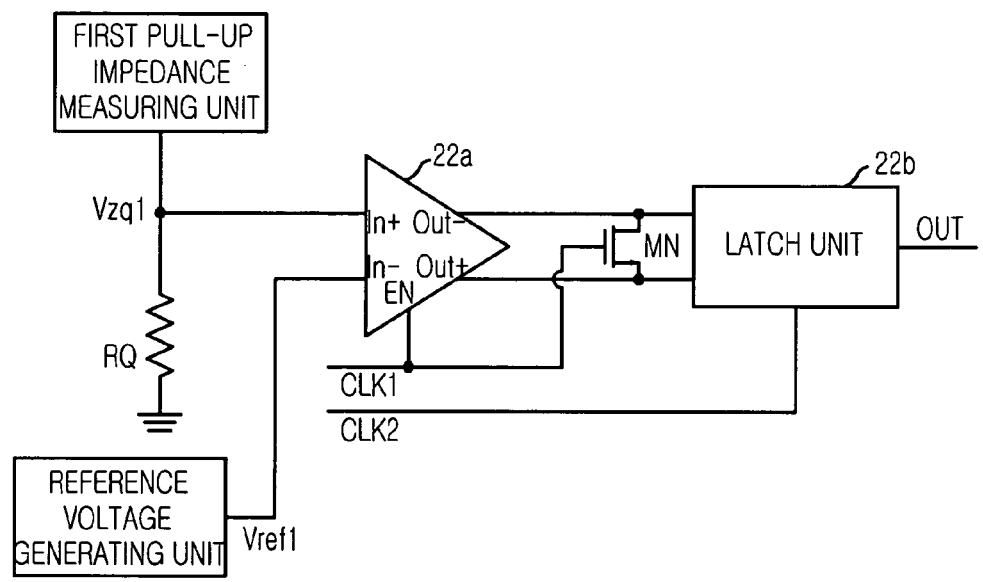
FIG. 6 is a block diagram depicting a comparing unit of the device for performing the OCD calibration control shown in FIG. 5 in detail.
Figure 7:
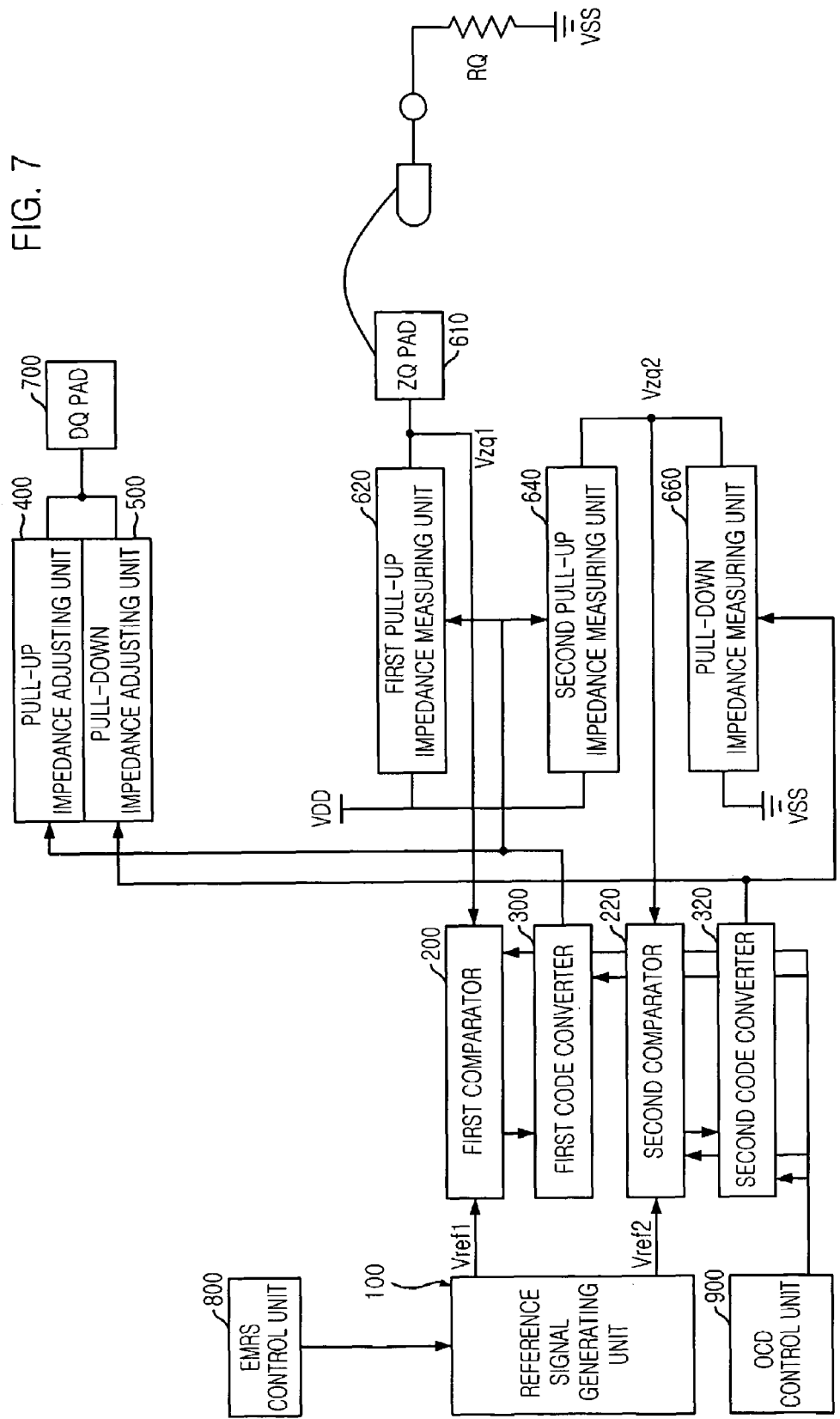
FIG. 7 is a block diagram showing a device for performing the OCD calibration control of a semiconductor memory device in accordance with an embodiment of the present invention.

FIG. 7 is a block diagram showing a device for performing the OCD calibration control of a semiconductor memory device in accordance with an embodiment of the present invention.

As shown, the device for performing the OCD calibration control in accordance with the embodiment of the present invention includes a reference signal generating unit 100, a pull-up comparing unit, a pull-down comparing unit, a pull-up impedance adjusting unit 400, a pull-down impedance adjusting unit 500, a test pad (hereinafter, referring to a ZQ PAD) 600, a first pull-up impedance measuring unit 620, a second pull-up impedance measuring unit 640, a pull-down impedance measuring unit 660, a data input/output (I/O) pad (hereinafter, referring to a DQ PAD) 700, a reference signal control unit 800 and an impedance control unit 900.

The reference signal generating unit 100 generates a first reference signal Vref1 and a second reference signal Vref2.

The pull-up comparing unit compares the first reference signal Vref1 with a pull-up test signal Vzq1 applied to the ZQ PAD 600 to output a first adjusted value to the ZQ PAD 600 by adjusting the first adjusted value until the pull-up test signal Vzq1 is equal to the first reference signal Vref1. The pull-down comparing unit compares the second reference signal Vref2 with a pull-down test signal Vzq2 applied to the ZQ PAD 600 to output a second adjusted value to the ZQ PAD by adjusting the second adjusted value until the pull-down test signal Vzq2 is equal to the second reference signal Vref2.

The first pull-up impedance measuring unit 620 adjusts a pull-up impedance of the ZQ PAD based on the first adjusted value. The second pull-up impedance measuring unit 640 supplies the pull-down test signal Vzq2 for the pull-down comparing unit based on the first adjusted value when the first reference signal Vref1 is equal to the pull-up test signal Vzq1. The pull-down impedance measuring unit 660 adjusts a pull-down impedance of the ZQ PAD 600 based on the second adjusted value.

The pull-up impedance adjusting unit 400 adjusts a pull-up impedance of the DQ PAD 700 in response to the first adjusted value outputted when the first reference signal Vref1 is equal to the pull-up test signal Vzq1. The pull-down impedance adjusting unit 500 adjusts a pull-down impedance of the DQ PAD 700 in response to the second adjusted value outputted when the second reference signal Vref2 is equal to the pull-down test signal Vzq2.

The reference signal control unit 800 controls the reference signal generating unit 100 to adjust a voltage level of the first reference signal Vref1 and the second reference signal Vref2. The impedance control unit 900 controls the first and the pull-down comparing unit so that in case that the pull-up test signal Vzq1 is equal to the first reference signal Vref1, the first adjusted value is outputted; and in case that the pull-down test signal Vzq2 is equal to the second reference signal Vref2, the second adjusted value is outputted. Herein, an extended mode register set (EMRS) control unit is used as the reference signal control unit 800 and an OCD control unit is used as the impedance control unit 900.

The pull-up comparing unit includes a first comparing unit 200 and a first code converter 300. The first comparing unit 200 compares the first reference signal Vref1 with the pull-up test signal Vzq1. The first code converter 300 decodes the comparison result of the first comparing unit 200 to supply plural pull-up decoding signals as the first adjusted value.

The pull-down comparing unit includes a second comparing unit 220 and a second code converter 320. The second comparing unit 220 compares the second reference signal Vref2 with the pull-down test signal Vzq2. The second code converter 320 decodes the comparison result of the second comparing unit 220 to supply plural pull-down decoding signals as the second adjusted value.

Figure 8:
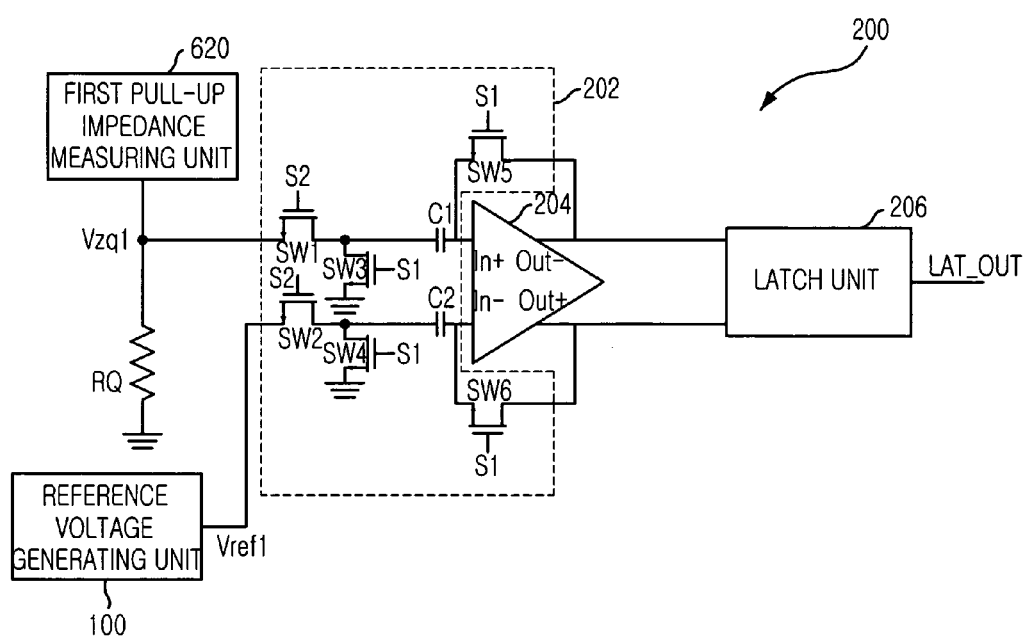
FIG. 8 is a block diagram depicting a comparing unit of the device for performing the OCD calibration control shown in FIG. 7 in detail.

FIG. 8 is a block diagram depicting the first comparing unit 200 of the device for performing the OCD calibration control shown in FIG. 7 in detail. Herein, the second comparing unit 220 has the same circuit structure as that of the first comparing unit 200. The first comparing unit 220 is explained as an example as follows.

As shown, the first comparing unit 220 includes a switched capacitive unit 202, a voltage comparator 204 and a latch unit 206.

The voltage comparator 204 compares a first input signal applied to a positive input node In+ with a second input signal applied to a negative input node In− to output a first output signal to a positive output node Out+ and a second output signal to a negative output node Out− based on the first and the second input signals. The switched capacitive unit 202 receives the reference signal and the test signal to remove an offset voltage occurred in the positive input node In+, the negative input node In−, the positive output node Out+ and the negative output node Out− of the voltage comparator 204. The latch unit 206 receives and latches the first output signal and the second output signal to output the latched value as an output signal LAT_OUT.

The switched capacitive unit 202 includes a first switch SW1, a second switch SW2, a third switch SW3, a fourth switch SW4, a fifth switch SW5, a sixth switch SW6, a first capacitor C1 and a second capacitor C2.

The first switch SW1 transfers the pull-up test signal Vzq1 to the positive input node In+. The second switch SW2 transfers the first reference signal Vref1 to the negative input node In−. The third switch SW3 transfers a ground voltage VSS to the positive input node In+. The fourth switch SW4 transfers the ground voltage VSS to the negative input node In−. The first capacitor C1 is located between the first switch SW1 and the positive input node In+ of the voltage comparator 204. The second capacitor C2 is located between the second switch SW2 and the negative input node In− of the voltage comparator 204. The fifth switch SW5 is located between the positive input node In+ and the negative output node Out− of the voltage comparator 204. The sixth switch SW6 is located between the negative input node In− and the positive output node Out+ of the voltage comparator 204.

Herein, the first and the second switches SW1 and SW2 are controlled by a second control signal S2, and the third to the sixth switches SW3 to SW6 are controlled by a first control signal S1.

As described above, the switched capacitive unit 202, including the first to the sixth switches SW1 to SW6 and the first and the second two capacitors C1 and C2, can remove the offset voltage by repeatedly turning on and turning off the first to the sixth switches SW1 to SW6 respectively, based on the first and the second control signal S1 and S2.

Figure 9:
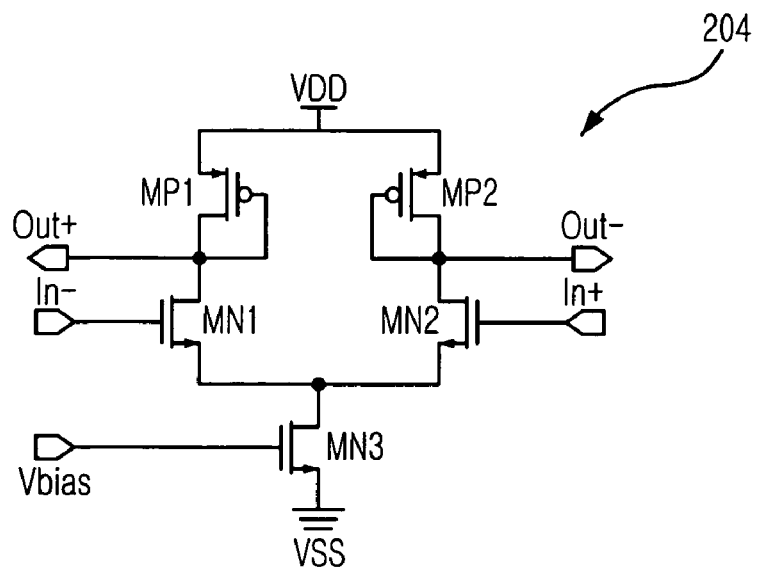
FIG. 9 is a block diagram showing a voltage comparator shown in FIG. 8 in detail.

FIG. 9 is a block diagram showing the voltage comparator 204 shown in FIG. 8 in detail.

As shown, the voltage comparator 204 includes a first PMOS transistor MP1, a second PMOS transistor MP2, a first NMOS transistor MN1, a second NMOS transistor MN2 and a third NMOS transistor MN3.

The first PMOS transistor MP1 has a source connected to the source voltage VDD and a drain connected to its gate to form a diode type. The second PMOS transistor MP2 has a source connected to the source voltage VDD and a drain connected to its gate to form a diode type. The first NMOS transistor MN1 has a gate for receiving the second input signal through the negative input node In− and a drain connected to the drain of the first PMOS transistor MP1. The second NMOS transistor MN2 has a gate for receiving the first input signal through the positive input node In+ and a drain connected to a drain of the second PMOS transistor MP2. The third NMOS transistor MN3 has a gate for receiving a bias voltage Vbias, a drain connected to sources of the first and the second NMOS transistors MN1 and MN2, and a source connected to the ground voltage VSS to thereby form a current source.

Herein, a signal at the drain of the first NMOS transistor MP1 is outputted to the positive output node Out+ as the first output signal and a signal at the drain of the second NMOS transistor MP2 is outputted to the negative output node Out− as the second output signal.

Figure 10:
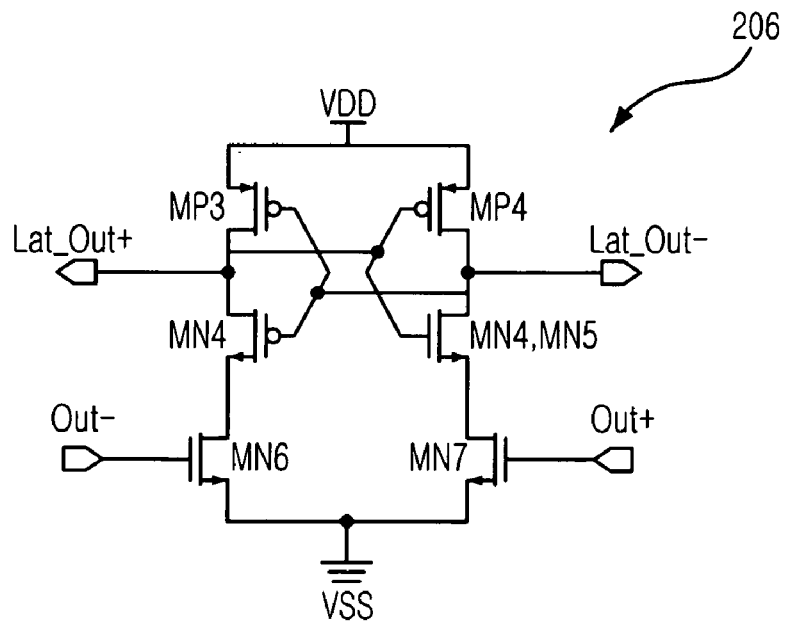
FIG. 10 is a block diagram showing a latch unit shown in FIG. 8 in detail.

FIG. 10 is a block diagram showing the latch unit 206 shown in FIG. 8 in detail.

As shown, the latch unit 206 includes a third PMOS transistor MP3, a fourth PMOS transistor MP4, a fourth NMOS transistor MN4, a fifth NMOS transistor MN5, a sixth NMOS transistor MN6 and a seventh NMOS transistor NM7.

The third PMOS transistor MP3 has a source connected to the source voltage VDD and a gate connected to a negative latch output node Lat_Out−. The fourth PMOS transistor MP4 has a source connected to the source voltage VDD and a gate connected to a positive latch output node Lat_Out+. The fourth NMOS transistor MN4 has a drain connected to a drain of the third PMOS transistor MN3 and a gate connected to the negative latch output node Lat_Out−. The fifth NMOS transistor MN5 has a drain connected to a drain of the fourth PMOS transistor MN4 and a gate connected to the positive latch output node Lat_Out+. The sixth NMOS transistor MN6 has a gate for receiving the negative output node Out− of the voltage comparator 204 and a drain-source path between a source of the fourth NMOS transistor MN4 and the ground voltage VSS. The seventh NMOS transistor MN7 has a gate for receiving the positive output node Out+ of the voltage comparator 204 and a drain-source path between a source of the fifth NMOS transistor MN5 and the ground voltage VSS.

Hereinafter, referring to FIGS. 7 to 10, an operational sequence of performing the OCD calibration control in. the semiconductor memory device is described as follows.

First, when the EMRS of the semiconductor memory device enters into the OCD calibration control operation, the EMRS control unit used as the reference signal control unit 800 sets the voltage level of the first reference signal Vref1 and the second reference signal Vref2. The first comparator 200 compares the first reference signal Vref1 with the pull-up test signal Vzq1 applied to the ZQ PAD 600.

In case that the first reference signal Vref1 is higher than the pull-up test signal Vzq1, the first pull-up impedance measuring unit 620 having plural PMOS transistors in parallel increases the number of turned-on PMOS transistors so that the pull-up impedance of the ZQ PAD 600 can be decreased. In case that the first reference signal Vref1 is lower than the pull-up test signal Vzq1, the first pull-up impedance measuring unit 620 decreases the number of turned-on PMOS transistors so that the pull-up impedance of the ZQ PAD 600 can be increased.

In case that the pull-up test signal Vzq1 is equal to the first reference signal Vref1, the pull-up impedance adjusting unit 400 having plural pull-up PMOS transistors in parallel adjusts the number of turned-on pull-up PMOS transistors. As a result, the pull-up impedance of the DQ PAD 700 can be determined.

In this time, it is possible to adjust the output impedance without error when the first comparator 200 compares the first reference signal Vref1 with the pull-up test signal Vzq1 exactly.

The semiconductor memory device in accordance with the embodiment of the present invention includes the switched capacitive unit as well as the voltage comparator to thereby remove the offset voltage which can be occurred in the voltage comparator. As a result, it is possible to compare the reference signal with the test signal exactly.

Referring to FIG. 7, if the first control signal S1 is enabled as a logic level 'HIGH', a voltage amount loaded to the first capacitor C1 and a voltage amount the second capacitor C2 are inputted to the voltage comparator 204. The voltage comparator 204 compares the inputted voltage amounts to thereby output amplified output values corresponding to the offset voltages. Herein, if there are no voltage amounts loaded to the first capacitor C1 or the second capacitor C2, there are no offset voltages. The amplified output values are feedbacked by the fifth switch SW5 and the sixth switch SW6 coupled to the voltage comparator 204.

In this time, the fifth switch SW5 located between the positive input node In+ and the negative output node Out− and the sixth switch SW6 located between the negative input node In− and the positive output node Out+ perform a negative feedback, not a positive feedback.

For example, if the offset voltage is existed at the positive input node In+ of the voltage comparator 204, the output value corresponding to the offset voltage is outputted to the positive output node Out+ of the voltage comparator 204. The output value of the positive output node Out+ is feedbacked to the negative input node In− by the sixth switch SW6 to be stored the second capacitor C2. Likewise, the output value of the negative output node Out− is feedbacked to the positive input node In+ by the fifth switch SW5 to be stored the first capacitor C1. In this way, the negative feedback is performed by the fifth switch SW5 and the sixth switch SW6. As a result, the output value transferred by the offset voltage is stored at the first capacitor C1 and the second capacitor C2.

After then, the first control signal S1 is disabled as a logic level 'LOW' and the second control signal S2 is enabled as a logic level 'HIGH', the voltage comparator 204 compares the pull-up test signal Vzq1 with the first reference signal Vref1. In this time, the first capacitor C1 and the second capacitor C2 operate as a coupling capacitor.

When the first control signal S1 is disabled, the voltage comparator 204 forms an open-loop so as to amplify the pull-up test signal Vzq1 and the first reference signal Vref1 with a predetermined gain. The latch unit 206 amplifies and outputs the output values by forming the positive feedback.

Because the second control signal S2 is enabled only when a sampling operation is performed, it does not need to turn on the first switch SW1 and the second switch SW2 continuously.

Accordingly, when a sampling operation is not performed, the first comparing unit 200 and the second comparing unit 220 are not affected by an inputted noise.

As above described, the semiconductor memory device in accordance with the embodiment of the present invention can stably compare the inputted signals without noise. Therefore, it is possible to reliably adjust the output impedance of the DQ PAD.

Further, the semiconductor memory device in accordance with the embodiment of the present invention can adjust the output impedance of the DQ PAD elaborately by performing an exact comparing operation.

The present application contains subject matter related to Korean patent application No. 2005-90061, filed in the Korean Patent Office on Sep. 27, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device for adjusting an output impedance of a data output driver, comprising:
   a reference signal generating unit for generating a reference signal;
   a comparing unit for comparing the reference signal with a test signal applied to a test pad to thereby output an adjusted value to the test pad after adjusting the adjusted value until the test signal is equal to the reference signal; and
   an impedance measuring unit for measuring an impedance of the test pad based on the adjusted value to output the test signal to the comparing unit,
   wherein the comparing unit includes:
   a voltage comparator for comparing a first input signal applied to its positive input node with a second input signal applied to its negative input node to output a first output signal to its positive output node and a second output signal to its negative output node;
   a switched capacitive unit for receiving the reference signal and the test signal to remove an offset voltage occurred in the positive input node, the negative input node, the positive output node and the negative output node of the voltage comparator; and
   a latch unit for latching the first output signal and the second output signal to output the adjusted value.

2. The semiconductor memory device as recited in claim 1, further comprising:
   an impedance adjusting unit for adjusting an impedance of a data input/output pad to have an impedance value corresponding to the adjusted value outputted when the test signal is equal to the reference signal;
   an impedance control unit for controlling the comparing unit so that the adjusted value is outputted when the test signal is equal to the reference signal; and
   a reference signal control unit for controlling the reference signal generating unit so as to adjust a voltage level of the reference signal.

3. The semiconductor memory device as recited in claim 1, wherein the switched capacitive unit includes:

a first switch for transferring the test signal to the positive input node based on a second control signal;
a second switch for transferring the reference signal to the negative input node based on the second control signal;
a third switch for transferring a ground voltage to the positive input node based on a first control signal;
a fourth switch for transferring the ground voltage to the negative input node based on the first control signal;
a first capacitor located between the first switch and the positive input node;
a second capacitor located between the second switch and the negative input node;
a fifth switch located between the positive input node and the negative output node and operating in response to the first control signal; and
a sixth switch located between the negative input node and the positive output node and operating in response to the first control signal.

4. The semiconductor memory device as recited in claim 3, wherein, if the first control signal is enabled, the fifth and the sixth switches perform a negative feedback operation.

5. The semiconductor memory device as recited in claim 3, wherein, if both of the first and the second control signals are enabled, the first and the second capacitors operate as coupling capacitors.

6. The semiconductor memory device as recited in claim 5, wherein, if the first and the second control signals are enabled, the voltage comparator forms an open-loop so as to amplify the test signal and the reference signal to have a predetermined gain.

7. The semiconductor memory device as recited in claim 1, wherein the voltage comparator includes:
a first PMOS transistor having a source connected to a source voltage terminal and a drain connected to its gate to form a diode type;
a second PMOS transistor having a source connected to the source voltage terminal and a drain connected to its gate to form a diode type;
a first NMOS transistor having a gate for receiving the second input signal and a drain connected to the drain of the first PMOS transistor;
a second NMOS transistor having a gate for receiving the first input signal and a drain connected to the drain of the second PMOS transistor; and
a third NMOS transistor having a gate for receiving a bias voltage, a drain connected to sources of the first and the second NMOS transistors, and a source connected to a ground voltage terminal to thereby form a current source.

8. The semiconductor memory device as recited in claim 7, wherein a signal at the drain of the first NMOS transistor is outputted as the first output signal and a signal at the drain of the second NMOS transistor is outputted as the second output signal.

9. The semiconductor memory device as recited in claim 1, wherein the latch unit includes:
a first PMOS transistor having a source connected to a source voltage terminal and a gate connected to a negative latch output node;
a second PMOS transistor having a source connected to the source voltage terminal and a gate connected to a positive latch output node;
a first NMOS transistor having a drain connected to a drain of the first PMOS transistor and a gate connected to the negative latch output node;
a second NMOS transistor having a drain connected to a drain of the second PMOS transistor and a gate connected to the positive latch output node;
a third NMOS transistor having a gate coupled to the negative output node of the voltage comparator and a drain-source path coupled between a source of the first NMOS transistor and a ground voltage terminal; and
a fourth NMOS transistor having a gate coupled to the positive output node of the voltage comparator and a drain-source path coupled between a source of the second NMOS transistor and the ground voltage terminal.

10. An apparatus for comparing inputted signals by removing an offset voltage during adjusting an output impedance of a semiconductor memory device, comprising:
a voltage comparator for comparing a first input signal applied to its positive input node with a second input signal applied to its negative input node to output a first output signal to its positive output node and its second output signal to a negative output node;
a switched capacitive unit for removing an offset voltage occurred in the positive input node, the negative input node, the positive output node and the negative output node of the voltage comparator; and
a latch unit for latching the first output signal and the second output signal.

11. The apparatus as recited in claim 10, wherein the switched capacitive unit includes:
a first switch for transferring a test signal to the positive input node based on a second control signal;
a second switch for transferring a reference signal to the negative input node based on the second control signal;
a third switch for transferring a ground voltage to the positive input node based on a first control signal;
a fourth switch for transferring the ground voltage to the negative input node based on the first control signal;
a first capacitor located between the first switch and the positive input node;
a second capacitor located between the second switch and the negative input node;
a fifth switch located between the positive input node and the negative output node and operating in response to the first control signal; and
a sixth switch located between the negative input node and the positive output node and operating in response to the first control signal.

12. The apparatus as recited in claim 11, wherein, if the first control signal is enabled, the fifth and the sixth switches perform a negative feedback operation.

13. The apparatus as recited in claim 11, wherein, if both of the first and the second control signals are enabled, the first and the second capacitors operate as coupling capacitors.

14. The apparatus as recited in claim 10, wherein the voltage comparator includes:
a first PMOS transistor having a source connected to a source voltage terminal and a drain connected to its gate to form a diode type;
a second PMOS transistor having a source connected to the source voltage terminal and a drain connected to its gate to form a diode type;
a first NMOS transistor having a gate for receiving the second input signal and a drain connected to the drain of the first PMOS transistor;
a second NMOS transistor having a gate for receiving the first input signal and a drain connected to the drain of the second PMOS transistor; and a third NMOS transistor having a gate for receiving a bias voltage, a drain connected to sources of the first and the second NMOS transistors, and a source connected to a ground voltage terminal to thereby form a current source, wherein a signal at the drain of the first NMOS transistor is outputted as the first output signal and a signal at the drain of the second NMOS transistor is outputted as the second output signal.

15. The apparatus as recited in claim 10, wherein the latch unit includes:
a first PMOS transistor having a source connected to a source voltage terminal and a gate connected to a negative latch output node;
a second PMOS transistor having a source connected to the source voltage terminal and a gate connected to a positive latch output node;
a first NMOS transistor having a drain connected to a drain of the first PMOS transistor and a gate connected to the negative latch output node;
a second NMOS transistor having a drain connected to a drain of the second PMOS transistor and a gate connected to the positive latch output node;
a third NMOS transistor having a gate coupled to the negative output node of the voltage comparator and a drain-source path coupled between a source of the first NMOS transistor and a ground voltage terminal; and
a fourth NMOS transistor having a gate coupled to the positive output node of the voltage comparator and a drain-source path coupled between a source of the second NMOS transistor and the ground voltage terminal.

* * * * *